(12) United States Patent
Bryant et al.

(10) Patent No.: US 6,392,329 B1
(45) Date of Patent: May 21, 2002

(54) PIEZOELECTRIC VIBRATING APPARATUS

(75) Inventors: Timothy D. Bryant, Gloucester; Glenn F. Rogers, Jr., Hampton; Samuel A. Face, Jr., Norfolk, all of VA (US)

(73) Assignee: Face International Corp., Norfolk, VA (US)

( * ) Notice: Subject to any disclaimer, the term of this patent is extended or adjusted under 35 U.S.C. 154(b) by 0 days.

(21) Appl. No.: 09/417,150

(22) Filed: Oct. 12, 1999

(51) Int. Cl.[7] .............................................. H01L 41/04
(52) U.S. Cl. ...................................................... 310/328
(58) Field of Search ................................. 310/328, 330, 310/331, 332

(56) References Cited

U.S. PATENT DOCUMENTS

| | | | | |
|---|---|---|---|---|
| 5,286,199 A | * | 2/1994 | Kipke | 310/311 |
| 5,471,721 A | * | 12/1995 | Haertling | 29/25.35 |
| 5,589,725 A | * | 12/1996 | Haertling | 310/358 |
| 5,780,958 A | * | 7/1998 | Strugach et al. | 310/348 |
| 5,821,371 A | * | 10/1998 | Alt et al. | 548/135 |
| 5,837,298 A | * | 11/1998 | Face, Jr. et al. | 425/456 |
| 5,973,441 A | * | 10/1999 | Lo et al. | 310/330 |
| 6,060,811 A | * | 5/2000 | Fox et al. | 310/311 |
| 6,075,310 A | * | 6/2000 | Bishop | 310/328 |
| 6,101,880 A | * | 8/2000 | Face, Jr. et al. | 73/579 |
| 6,140,745 A | * | 10/2000 | Bryant | 310/353 |
| 6,150,752 A | * | 11/2000 | Bishop | 310/328 |

* cited by examiner

*Primary Examiner*—Nestor Ramirez
*Assistant Examiner*—Peter Medley
(74) *Attorney, Agent, or Firm*—Stephen E. Clark; David J. Bolduc

(57) ABSTRACT

A piezoelectrically actuated vibratory motor comprises actuators that are mounted "vertically" with their edges attached to top and bottom mounting members. An oscillating voltage applied to the actuators causes them to contract and expand to move the attached mounting members in a direction essentially parallel to the faces of the actuators. The force transmitted to the mounting members at the edges of actuators is greater than the typical force taken at the center of a face of the actuator.

12 Claims, 5 Drawing Sheets

PIEZOELECTRIC VIBRATING APPARATUS

BACKGROUND OF THE INVENTION

1. Field of Invention

The present invention relates to vibrating motors using piezoelectric actuators. More particularly the present invention is directed to vibrating motors and methods of mechanically mounting the piezoelectric actuators in motors to transfer vibrational energy through an attached plate and flexible membrane to a work surface.

2. Description of the Prior Art

Piezoelectric and electrostrictive materials develop a polarized electric field when placed under stress or strain. Conversely, they undergo dimensional changes in an applied electric field. The dimensional change (i.e., expansion or contraction) of a piezoelectric or electrostrictive material is a function of the applied electric field.

A typical prior ceramic device such as a direct mode actuator makes direct use of a change in the dimensions of the material, when activated, without amplification of the actual displacement. Direct mode actuators typically include a piezoelectric or electrostrictive ceramic plate sandwiched between a pair of electrodes formed on its major surfaces. The device is generally formed of a sufficiently large piezoelectric and/or electrostrictive coefficient to produce the desired strain in the ceramic plate. However, direct mode actuators suffer from the disadvantage of only being able to achieve a very small displacement (strain), which is, at best, only a few tenths of a percent.

Indirect mode actuators are known in the prior art to provide greater displacement than is achievable with direct mode actuators. Indirect mode actuators achieve strain amplification via external structures. An example of an indirect mode actuator is a flextensional transducer. Prior flextensional transducers are composite structures composed of a piezoelectric ceramic element and a metallic shell, stressed plastic, fiberglass, or similar structures. The actuator movement of conventional flextensional devices commonly occurs as a result of expansion in the piezoelectric material which mechanically couples to an amplified contraction of the device in the transverse direction. In operation, they can exhibit several orders of magnitude greater displacement than can be produced by direct mode actuators.

The magnitude of the strain of indirect mode actuators can be increased by constructing them either as "unimorph" or "bimorph" flextensional actuators. A typical unimorph is a concave structure composed of a single piezoelectric element externally bonded to a flexible metal foil, and which results in axial buckling or deflection when electrically energized. Common unimorphs can exhibit a strain of as high as 10% but can only sustain loads that are less than one pound. A conventional bimorph device includes an intermediate flexible metal foil sandwiched between two piezoelectric elements. Electrodes are bonded to each of the major surfaces of the ceramic elements and the metal foil is bonded to the inner two electrodes. Bimorphs exhibit more displacement than comparable unimorphs because under the applied voltage, one ceramic element will contract while the other expands. Bimorphs can exhibit strains up to 20% (i.e. about twice that of unimorphs), but, like unimorphs, typically can only sustain loads which are less than one pound.

A unimorph actuator called "THUNDER", which has improved displacement and load capabilities, has recently been developed and is disclosed in U.S. Pat. No. 5,632,841. THUNDER (which is an acronym for THin layer composite UNimorph ferroelectric Driver and sEnsoR), is a unimorph actuator in which one or more pre-stress layers are bonded to a thin piezoelectric ceramic wafer at high temperature. Cooling the composite structure asymmetrically stress biases the ceramic wafer due to the difference in thermal contraction rates of the ceramic layer and the pre-stress layers (or substrate). In other words, as the substrate(s) and adhesive cool they contract more than the ceramic to which they are bonded. This places the ceramic layer under compression and the substrate in tension. Because the ceramic layer in compression is bonded to the substrate(s) in tension, the assembled actuator assumes its normal arcuate shape. This prestress condition which compresses the ceramic layer enables the ceramic to be less susceptible to cracking as well as increasing the amount of deformation and resultant strain that the actuator may experience.

In operation a THUNDER actuator may be energized by an electric power supply via a pair of electrical wires which are typically soldered to the metal prestress layers (substrates) or to the electroplated faces of the ceramic layer. When a voltage of a first polarity is applied across the ceramic layer, the ceramic contracts (in the direction of the tension in the substrate), which causes the actuator to relax and flatten (position 99 in FIG. 4). When a voltage of an opposite polarity is applied across the ceramic layer, the ceramic layer expands (increasing the tension in the substrate), which causes the actuator to become more concave (position 101 in FIG. 4). By applying an alternating voltage, the ceramic layer in the actuator can cyclically contract and expand, which causes the actuator to alternately become more and less concave (as illustrated by positions 99 and 101 in FIG. 4).

In practice, these actuators 100 have been used to directly drive a pressure plate 8 or other mechanism in a prior art cyclic motor as shown in FIG. 1. Typically, the convex face 100a of the actuator 100 would directly push (in the direction of arrow 7) against a plate 8 at the lowest point of its curvature, and the plate 8 would maintain contact with the actuator 100, returning to its rest position through the use of a spring mechanism 6.

FIG. 2 illustrates another device using multiple stacked actuators 100. Each actuator 100 has its edges 11 mounted in slots 67 in the sidewalls 70 of a housing 72. The actuators 100 and their electrical connections are electrically isolated from each other using spacers 33, typically TEFLON™ insulators, that are mounted to a spring 6 biased drive shaft 32. The drive shaft 32 may be further mounted to a pressure plate 8 or other motion translating means (not shown).

A problem with the above described mounting methods for a direct drive actuator is that the force against the actuator 100 was concentrated on one point, or at least in a very small area of the actuator 100. This would cause the ceramic 10 in the actuator 100 or the whole actuator 100 to break due to point load concentration. The actuator 100 would then lose most of its effectiveness because it could not generate as much force or displacement with a cracked ceramic 10.

Another problem with prior art actuator mounting methods is that a single actuator typically could not generate sufficient force for higher output applications. This is especially true of applications where the pressure plate against which the actuator acted was spring mounted. The actuator dissipated a large amount of its useful force in trying to overcome the spring mechanism. The force generated for some applications would also fracture the ceramic layer of the actuator.

Another problem with prior art actuator mounting methods is that even a stack of actuators acting against a pressure plate typically could not generate sufficient force for higher output applications.

Another problem in applications using multiple, stacked actuators was that the spacers add weight to the motor as well as opposing the motion of the actuators, dissipating the useful force and displacement in the stacked actuators. The actuators also dissipated a large amount of their useful force in trying to overcome the spring mechanism. The force generated for some applications would also fracture the ceramic layer of the actuator.

Another problem with prior mounting methods for single or multiple actuators was that where a lightweight motor was desired, the use of a housing in which to mount actuator edges would add extra weight to the motor.

SUMMARY OF THE INVENTION

The present invention provides a vibrational motor and a method of mounting piezoelectric actuators or stacks of piezoelectric actuators on the vibrational motor. Specifically, the present invention provides a vibrational motor in which, relative to prior art devices, the weight and dissipative forces are minimized, load distribution is more uniform and mechanical mounting is more secure. In the preferred embodiment, THUNDER type piezoelectric actuators are attached at their edges to top and bottom mounting members, and this motor assembly is attached to the blade of a vibrational tool. This vibrating tool may advantageously be used to modify the texture or character (i.e. the "finish") of a surface of a work material or for other purposes. The vibratory action of the tool is generated by one or more piezoelectric actuators which, when energized, vibrate at the frequency of the applied voltage. The piezoelectric actuators are mounted in a motor assembly that is attached to a reaction mass, a blade/plate and a flexible membrane. In the preferred embodiment of the invention, the vibrations are transferred from the motor and attached mass through the blade and flexible membrane at the bottom of the tool and into plastic concrete work material. This vibration causes air and water to rise to the surface of the concrete creating a slurry, which is desirable for producing a smooth surface finish. The motor assembly is sufficiently light that a reaction mass may be attached to it to tune the amplitude and resultant force of the vibrations which are transferred to the blade of the vibrational tool. The reaction mass also ensures that the majority of vibrations are transferred in the appropriate direction, i.e., downward to the work surface. This, coupled with the lightweight design and other characteristics described hereinbelow, makes the tool very easy to handle and operate.

Accordingly, it is a primary object of the present invention to provide a mounting for a piezoelectric actuator that allows for the production of the force and displacement for motor applications.

It is a further object of the present invention to provide a device of the character described in a lightweight piezoelectrically actuated vibrating tool.

It is a further object of the present invention to provide a device of the character described in which multiple actuators are used to produce high force in a drive mechanism.

It is a further object of the present invention to provide a device of the character described in which loads driven by the actuator are effectively distributed across the structure of the actuator to avoid fracture of the ceramic element of the piezoelectric actuator.

It is a further object of the present invention to provide a device of the character described in which stacked actuators are mounted without adding undue weight.

It is a further object of the present invention to provide a device of the character described in which losses in force and displacement are minimized through effective coupling to a drive mechanism.

It is another object of the present invention to provide a device of the character described in which the mechanical mounting of the actuators is particularly secure.

It is another object of the present invention to provide a device of the character described which is at the same time compact, light in weight, and of an extremely simple and uncluttered design.

It is another object of the present invention to provide handheld concrete/cement working tools of an automatically vibrating variety wherein a substantial vibratory energy is imparted to the concrete surface.

It is another object of the present invention to provide a device of the character described in which there is minimal vibration transmitted through the handle (and subsequently to the operator) in proportion to the amount of vibration transmitted through the bottom of the device and into the concrete.

It is another object of the present invention to provide a device of the character described wherein a reaction mass is provided to tune the amplitude to the vibratory energy imparted through the tool.

It is another object of the present invention to provide a device of the character described wherein It is another object to provide a modification of the present invention in which the vibratory energy is imparted in the frequency range of 50 to 500 hertz.

It is another object to provide a modification of the present invention in which the frequency of vibration is easily user-modified.

It is another object of the present invention to provide a device of the character described which is battery powered.

It is another object of the present invention to provide a device of the character described wherein multiple motors may vibrate the vibrational tool, or multiple tools may be attached to form a larger one.

It is another object of the present invention to provide a device of the character described wherein the blades of individual tools operate synchronously while being linked with a flexible membrane.

Further objects and advantages of this invention will become apparent from a consideration of the drawings and ensuing description thereof.

DESCRIPTION OF THE PREFERRED EMBODIMENT

Figure 1:
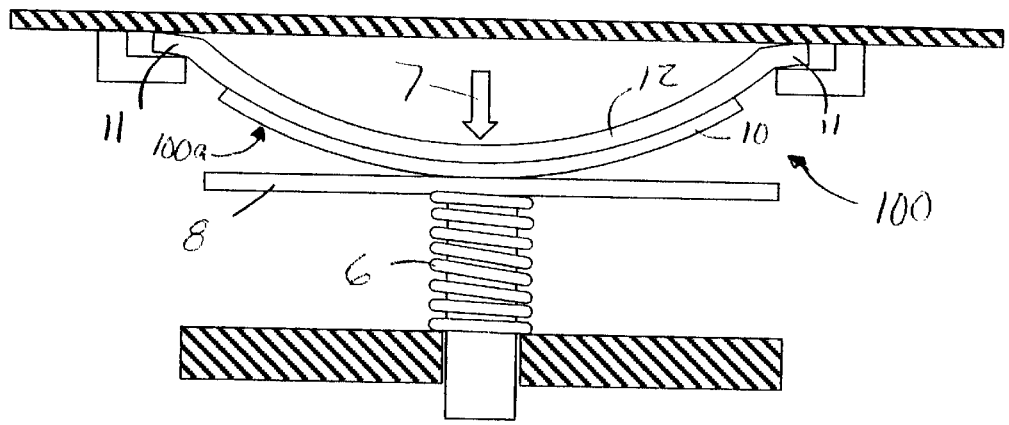
FIG. 1 is an elevational view showing a motor with a piezoelectric actuator directly actuating a spring-mounted driver as in the prior art.

With initial reference directed toward FIG. 5 of the appended drawings a piezoelectrically actuated vibrating motor and associated tool embodying the principles and concepts of the present invention and generally designated by the reference numeral 1 will be described.

Figure 3:
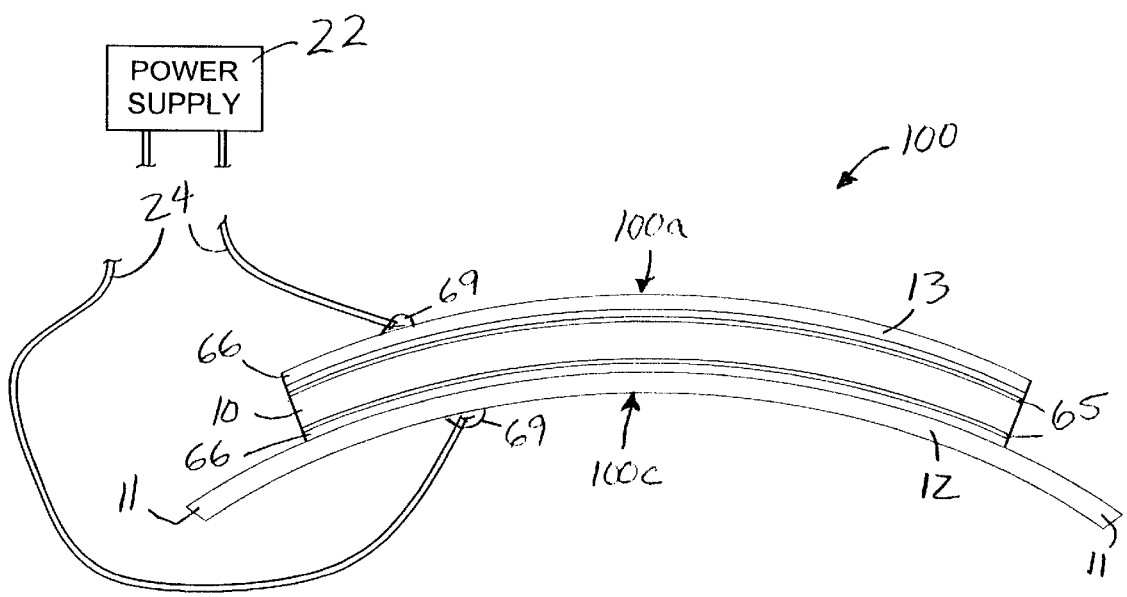
FIG. 3 is a side elevation of the piezoelectric actuator used in the preferred embodiment of the present invention, showing details of construction of the actuator.

The device providing the motive force in the present invention is a flextensional piezoelectric actuator. Various constructions of flextensional piezoelectric actuators may be used (including, for example, "moonies", "rainbows", and other unimorph, bimorph, multimorph or monomorph devices, as disclosed in U.S. Pat. No. 5,471,721), but the actuator 100 preferably comprises a Thin Layer Unimorph Driver and Sensor ("THUNDER™"). As shown in FIG. 3, the THUNDER actuator 100 is a composite structure comprising a piezoelectric ceramic layer 10 bonded to at least one metal substrate (prestress layer) 12 with an adhesive 65. Each THUNDER actuator 100 is preferably constructed with a PZT piezoelectric ceramic layer 10 that is electroplated 65 on its two opposing faces. A steel, stainless steel, beryllium alloy or other metal first prestress layer 12 (preferably spring steel) is adhered to the electroplated 65 surface on one side of the ceramic layer 10 by an adhesive layer 66. The adhesive layer 66 is preferably LaRC™-SI material, as developed by NASA-Langley Research Center and commercially marketed by IMITEC, Inc. of Schenectady, N.Y. Another adhesive layer 66, also preferably comprising LaRC™-SI material, is adhered to the opposite side of the ceramic layer 10. One or more additional prestress layer(s) 13 may be similarly adhered to either or both sides of the ceramic layer 10 in order, for example, to increase the stress in the ceramic layer 10 or to strengthen the actuator 100. Preferably, a second prestress layer 13 is also a metal substrate comprising a layer of aluminum bonded to the side of the ceramic 10 opposite the first prestress layer 12.

During manufacture of the THUNDER™ actuator 100 the ceramic layer 10, the adhesive layers 66 and the prestress layers 12 and 13 are simultaneously heated to a temperature above the melting point of the adhesive material 66, and then subsequently allowed to cool, thereby re-solidifying and setting the adhesive layers 66. During the cooling process the ceramic layer 10 becomes compressively stressed due to the higher coefficient of thermal contraction of the material of the prestress layers 12 and 13 and the adhesive 66 than for the material of the ceramic layer 10. Also, due to the greater thermal contraction of the laminate materials (e.g. the first pre-stress layer 12 and the adhesive 66) on one side of the ceramic layer 10 relative to the thermal contraction of the laminate material(s) (e.g. the second prestress layer and adhesive 66) on the other side of the ceramic layer 10, the ceramic layer deforms in an arcuate shape having a normally concave face 100c and a normally convex face 100a, as illustrated in FIG. 3. In other words, during the cooling process the adhesive solidifies and bonds the metal substrates 12 and 13 to the ceramic 10. As cooling continues the adhesive 66 and substrates 12 and 13 thermally contract more than the ceramic 10. This places the ceramic layer 10 under compression and the substrates 12 and 13 in tension. Because the ceramic layer 10 in compression is bonded to one or more metal substrates 12 in tension, the assembled actuator 100 assumes a normally arcuate shape. Thus, the substrates 12 and 13 (and adhesives) act as prestress layers, which place the ceramic layer 10 in a state of compression. The prestress condition which places the ceramic layer 10 in compression enables the ceramic 10 to be less susceptible to cracking as well as increases the amount of deformation and resultant strain that the actuator 100 may undergo.

It will be appreciated by those skilled in the art that by using an actuator 100 comprising a pre-stressed piezoelectric element (e.g. THUNDER actuator) the strength, durability, and piezoelectric deformation (i.e. output) are each greater than would normally be available from a comparable piezoelectric element which is not pre-stressed. Accordingly, in the preferred embodiment of the invention it is desirable to employ actuators 100 comprising pre-stressed piezoelectric elements; however, non-pre-stressed piezoelectric elements may alternatively be used in modified embodiments of the present invention.

As illustrated in FIG. 3, electrical energy may be introduced to the THUNDER™ actuator 100 from an electric power supply 22 by a pair of electrical wires 24 attached to opposite sides of the actuator 100 in communication with the electroplated faces 65 of the ceramic layer 10. As discussed above, the prestress layers 12 and 13 are preferably adhered to the ceramic layer 10 by LaRC™-SI material. The wires 24 may be connected (for example by glue or solder 69) directly to the electroplated faces 65 of the ceramic layer 10, or they may alternatively be connected to the prestress layers 12 and 13. LaRC™-SI is a dielectric. When the wires 24 are connected to the prestress layers 12 and 13, it is desirable to roughen a face of each prestress layer 12 and 13, so that the prestress layers 12 and 13 intermittently penetrate the respective adhesive layers 66, and make electrical contact with the respective electroplated faces 65 of the ceramic layer 10.

Figure 4:
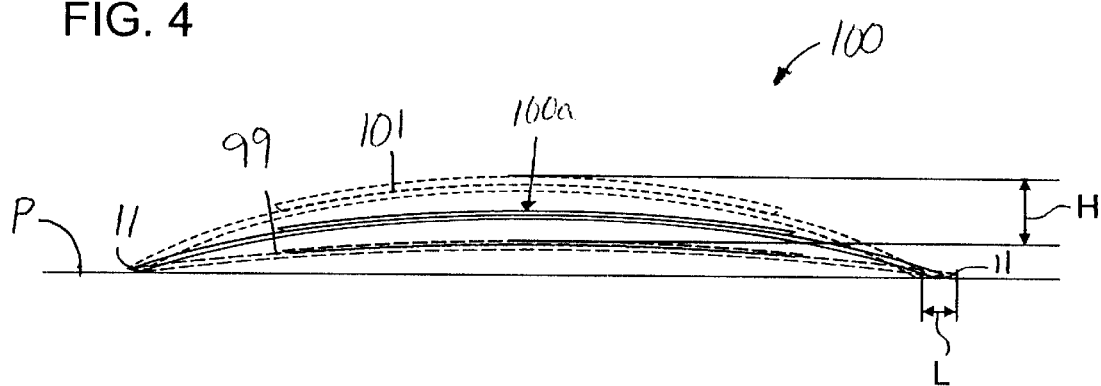
FIG. 4 is a side elevation showing the piezoelectric actuator of FIG. 3 and its ranges of motion.

Referring to FIG. 4: In operation when a voltage of a first polarity is applied across the ceramic layer 10, the ceramic 10 contracts (in the direction of the tension in the substrate 12), which causes the actuator 100 to relax and flatten as in position 99. When a voltage of an opposite polarity is applied across the ceramic layer 10, the ceramic layer 10 expands (increasing the tension in the substrate 12), which causes the actuator 100 to become more concave as in position 101. By applying an alternating voltage to the actuator, the ceramic layer 10 will cyclically contract and expand, which causes the actuator 100 to alternately become more and less concave (as illustrated by positions 99 and 101 in FIG. 4).

The total displacement that an arcuate actuator achieves perpendicular to its face 100a is illustrated in FIG. 4, which shows the actuator 100 with its straight edges 11 resting on a plane P and showing the actuator 100 at positions of least and greatest degrees of concavity (positions 99 and 101). The arcuate face 100a of the actuator has its least degree of curvature in position 99 where the height of the center of the face 100a above the plane P is at its minimum. The arcuate face 100a of the actuator has its greatest degree of curvature in position 101 where the height of the center of the face 100a above the plane P is at its maximum. The achievable range of displacement taken at the center of one face 100a of the actuator 100 from its minimum to its maximum height above the plane P is shown by arrows H.

The total displacement that an arcuate actuator achieves parallel to its face 100a is illustrated in FIG. 4, which shows the actuator 100 with its straight edges 11 resting on a plane P and showing the actuator 100 at positions of least and greatest degrees of concavity (positions 99 and 101). More specifically, FIG. 4 illustrates the displacement of the edges 11 of the actuator 100 in a direction parallel to the plane P on which the edges 11 of the actuator 100 lie. The arcuate face 100a of the actuator has its least degree of curvature in position 99 where the distance between the edges 11 of the actuator 100 in the plane P is at its maximum. The arcuate face 100a of the actuator has its greatest degree of curvature in position 101 where the distance between the edges 11 of the actuator 100 in the plane P is at its minimum. The achievable range of displacement taken at the edges 11 of the actuator 100 in the plane P is shown by arrows L.

The range of displacement H in a direction perpendicular to and taken from the center of a face 100a of the actuator 100 is much greater than the range of displacement L of the actuator 100 taken at an edge 11 and parallel to the plane P. Devices such as those in FIGS. 1 and 2 were mounted at the center of the face 100a of an actuator in order to take advantage of the maximum displacement at that point 100a of the actuator 100. These devices however may not provide sufficient force for some applications.

The edges 11 of the actuator have a lower range of displacement (in the direction parallel to the plane P) than does the center of the face 100a of the actuator 100 (in a direction perpendicular to the face 100a of the actuator). Conversely, the edges 11 of the actuator generate a greater force (in the direction parallel to the plane P) than does the center of the face 100a of the actuator 100 (in a direction perpendicular to the face 100a of the actuator). Thus, the center of the face 100a of the actuator 100 generates a high displacement H with low force in a direction perpendicular to the face 100a of the actuator 100, and the edge 11 of the actuator 100 generates comparatively lower displacement L at higher forces in a direction parallel to the plane P in which the straight edges 11 lie. From a total work standpoint of the device, the work (force times distance) done by the actuator 100 is approximately the same taken either at the center of the face 100a of the actuator 100 or at the edges ii.

Figure 5:
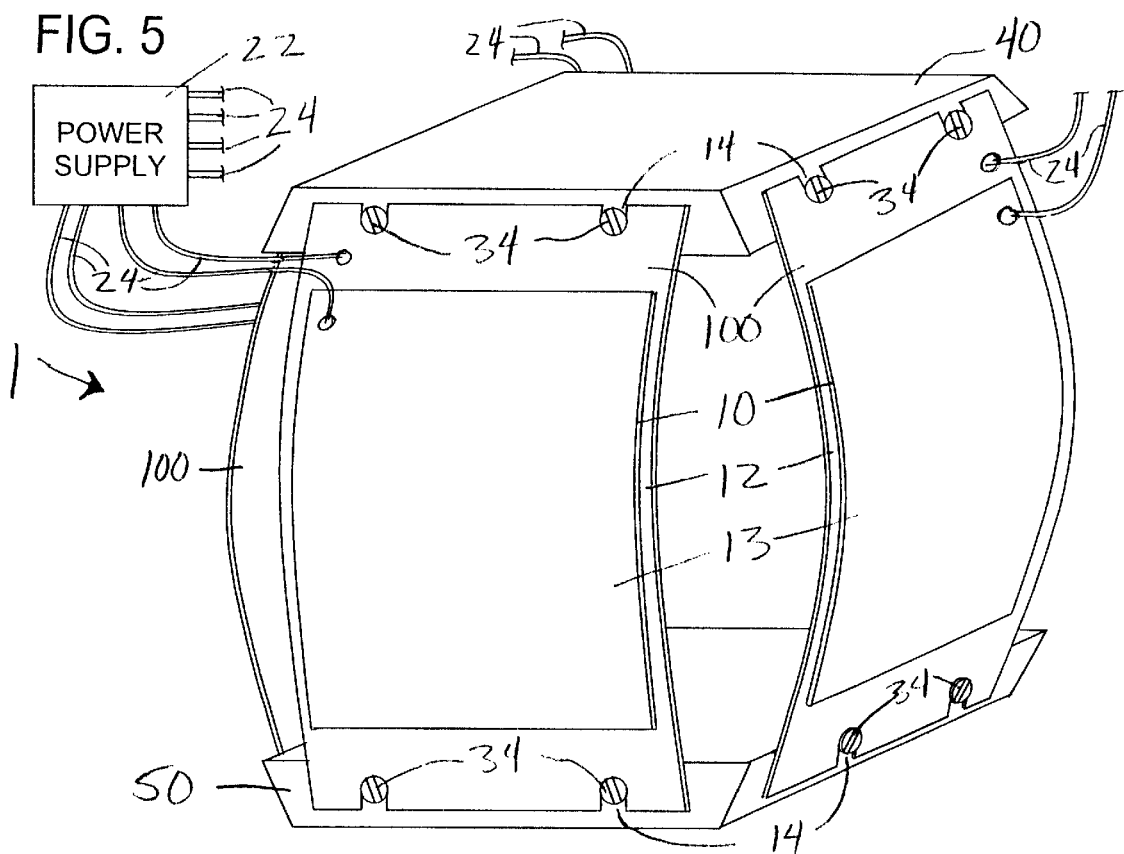
FIG. 5 is perspective view of the preferred embodiment of the present invention.

Referring now to FIGS. 4 and 5: In the preferred embodiment of a piezoelectrically actuated vibratory motor 1, the actuators 100 are mounted "vertically" to a top mounting member 40 and a bottom mounting member 50. The actuators 100 contract and expand in the directions of arrows H and L, which may move the top and bottom members up and down in the direction of arrow L. As used herein, the words "up", "down", "vertical" and cognate terms refer to directions parallel to the contraction and expansion of the actuator 100 along arrow L in FIG. 4. The words "horizontal", "longitudinal" and cognate terms refer to directions parallel to the contraction and expansion of the actuator 100 along arrow H in FIG. 4. The words "top" and "bottom" and cognate terms refer to positions with respect to opposite edges 11 of an actuator 100. The motor 1 however may be oriented so that the "top" and "bottom" mounting members 40 and 50 are disposed vertically from each other as depicted in FIG. 5, or the motor 1 may be rotated, oriented "upside down" or "sideways" depending upon the desired axis of vibration for an application.

The mounting members 40 and 50 are preferably made of a rigid, light-weight material, such as aluminum or plastic. The mounting members 40 and 50 however need not be solid throughout. The mounting members 40 and 50 need only as much material as is necessary to secure actuators 100 to their sides and motion translation means to their centers (discussed below). To that end, the mounting members 40 and 50 may be of a honeycomb or annular construction. The mounting member 40 illustrated in FIG. 6 has a square cross-section in a plan view. However, as shown in FIGS. 5 and 7, the mounting members 40 and 50 have a trapezoidal cross-section in elevation. The trapezoidal elevation of the mounting members 40 and 50 is due to their having a beveled edge (preferably approximately seven degrees) to accommodate the curvature of the actuators 100. This bevel allows the angle of edge of the mounting member 40 or 50 to match the angle that the edge 11 of the actuator 100 makes with the vertical (plane P). Although mounting members 40 and 50 of square cross-section (in plan view) are depicted in the drawings, the mounting members 40 and 50 may have cross-sections that are triangular, hexagonal or many other regular or irregular polygons. Drill holes (not shown) are tapped normal to the beveled surface of the mounting members 40 and 50.

The edges 11 of the actuators 100 have at least two slots 14 that can accommodate securing means. The edges 11 of the actuators are secured at the slots 14 to top and bottom mounting members 40 and 50. The actuators 100 are attached to the mounting members 40 and 50 with securing means, for example screws 34, through the slots 14 in the edges 11 of the actuators 100 into the drill holes. Although FIGS. 5 and 6 show four actuators 100 mounted to the mounting members 40 and 50, as few as two actuators 100 may be mounted to two opposite sides of the top and bottom mounting members 40 and 50.

Referring to FIG. 7: More actuators 100 may be secured to the sides of the mounting members 40 and 50. If more than one actuator 100 is mounted on a side of the mounting members 40 and 50, then a washer 35 made of an insulating material should be placed on each screw 34 between the two actuators 100. In the motor 1 illustrated in FIG. 7, two actuators 100 are stacked and secured to each side of the mounting members 40 and 50. Although FIG. 7 shows two actuators 100 mounted on each side of the mounting members 40 and 50, the actuators 100 need not be added in multiples of four. Many combinations of actuators 100 may be secured to each side of the mounting members 40 and 50 ranging from no actuators 100 on a side to several on a side. The motor 1 may function with as few as two actuators 100 on opposite sides of the mounting members 40 and 50, however to improve stability it is preferable to have more than two actuators 100 mounted to the mounting members 40 and 50. Preferably there is at least one actuator 100 one each side of the mounting members 40 and 50. Having at least one actuator 100 on each side of the mounting members 40 and 50 reduces the effect of shear forces on the motor 1 as compared to a motor 1 with actuators 100 on less than all sides. The mounting of at least one actuator 100 on each side of the motor 1 provides greater stability to the motor 1 and helps eliminate the sway caused by these shear forces and the associated dissipation/misdirection of force.

Figure 2:
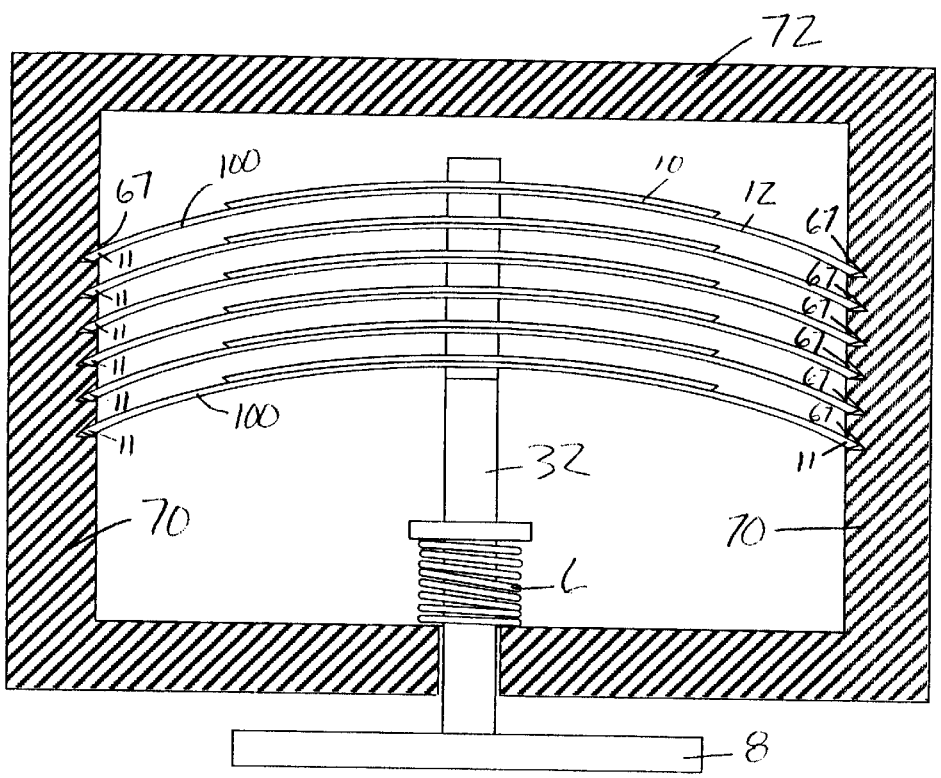
FIG. 2 is a cross-sectional side view showing a piezoelectric motor having vertically spaced apart piezoelectric actuators as in the prior art.
Figure 6:
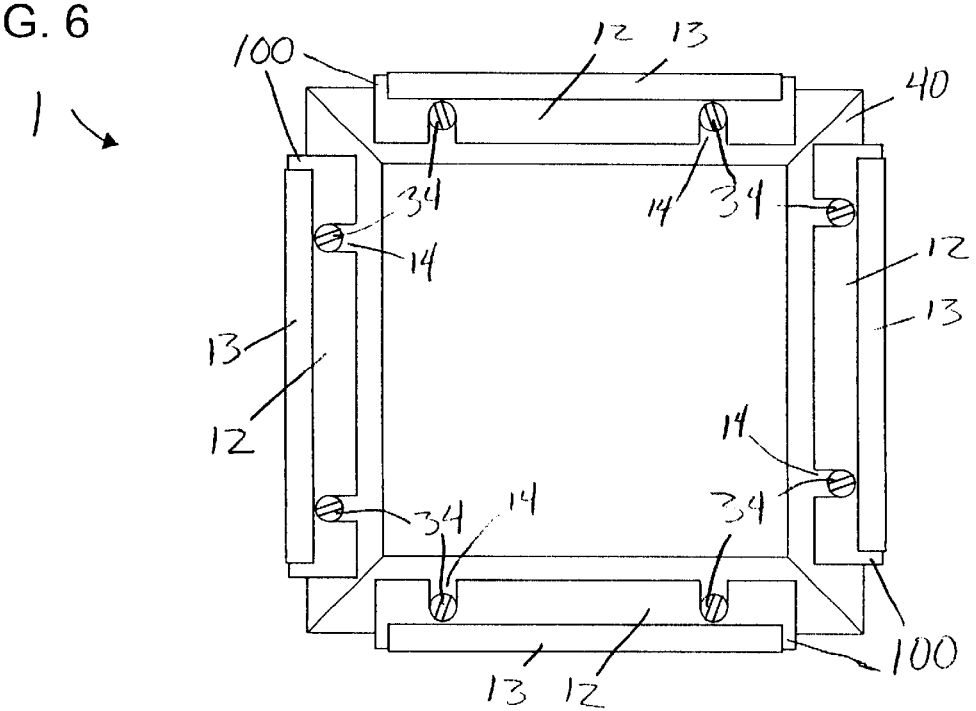
FIG. 6 is a plan view of the piezoelectric motor in FIG. 5.
Figure 7:
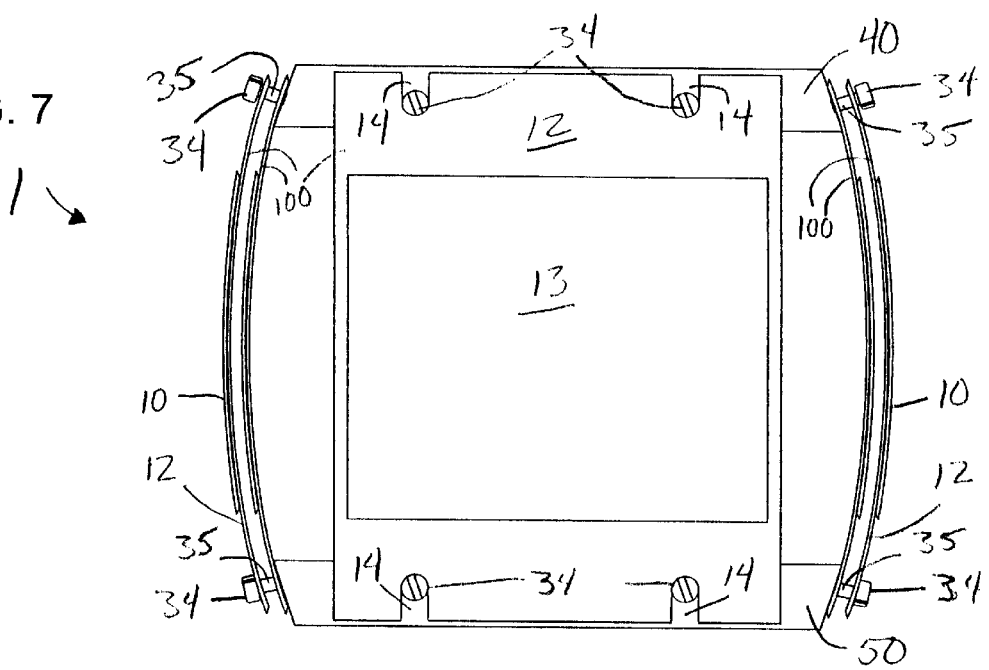
FIG. 7 is an elevation of a modification of the present invention illustrating two piezoelectric actuators mounted on each side of the motor mounting members.

The design of the motor 1 in FIGS. 5–7 has greater simplicity than the designs of the prior art illustrated in FIGS. 1 and 2. There are fewer parts to the motor 1 and therefor less weight. The housing and the slotted side walls of the prior art are eliminated. Furthermore, the spring mechanism 6 of the prior art devices is eliminated. This is because vertical orientation of the actuators 100 allows the metal substrates 12 and 13 to fulfill the function of the spring 6 in prior devices. Elimination of the spring 6 also decreases the weight of the motor 1, and eliminates the need for the actuators 100 to overcome the opposition of a spring 6, which dissipates the achievable force of the motor 1. Furthermore, by taking the output motion of the actuator at the edges 11, the need for spacers 33 clamped at the center of the faces 100a and 100c of each of the horizontally mounted actuators 100 as in the prior art is eliminated. The spacers 33 also opposed the bending motion of the actuator 100, as well as added additional weight to the motor 1. The elimination of clamped spacers 33 thus reduces weight and the opposition of the spacers 33 that dissipate the achievable force of the motor 1. Reduction of the weight of the motor 1 makes it easier to tune (with attached masses) the amplitude of vibrations and hence the deliverable force of the motor 1. Reduction of the weight of the motor 1 also makes a lightweight device which is easier to for a user to operate. Reduction of the weight of the motor 1 also helps to provide a lightweight device which is less likely to damage a plastic work surface such as fresh concrete.

In operation the motor 1 vibrates when the actuators 100 are energized by an electric power supply 22 via a pair of electrical wires 24 which are typically soldered 69 or glued to the metal substrates 12 and 13, or to the electroplated faces of the ceramic layer 10. When a voltage of a first polarity is applied across the ceramic layer 10, the ceramic 10 contracts which causes the actuator 100 to relax and flatten as in position 99 in FIG. 4. When a voltage of an opposite polarity is applied across the ceramic layer 10, the ceramic layer 10 expands which causes the actuator 100 to become more concave as in position 101 in FIG. 4. By applying an alternating voltage, the ceramic layer 10 in the actuator 100 will cyclically contract and expand, which causes the actuator 100 to alternately become more and less concave, oscillating at the frequency of the applied voltage between positions 99 and 101.

As the actuators 100 expand and contract, the edges 11 of the actuators 100 move in the direction of arrow L parallel to plane P. Because the edges 11 of the actuators 100 are secured to the top and bottom mounting members 40 and 50, the mounting members 40 and 50 also move in the direction of arrow L parallel to plane P. If one mounting member, for example the bottom mounting member 50, is held stationary, then the top mounting member 40 will move back and forth in the direction of arrow L parallel to plane P in response to the applied oscillating voltage. Conversely, if the top mounting member 40, is held stationary, then the bottom mounting member 50 will move back and forth in the direction of arrow L parallel to plane P in response to the applied oscillating voltage.

Figure 8:
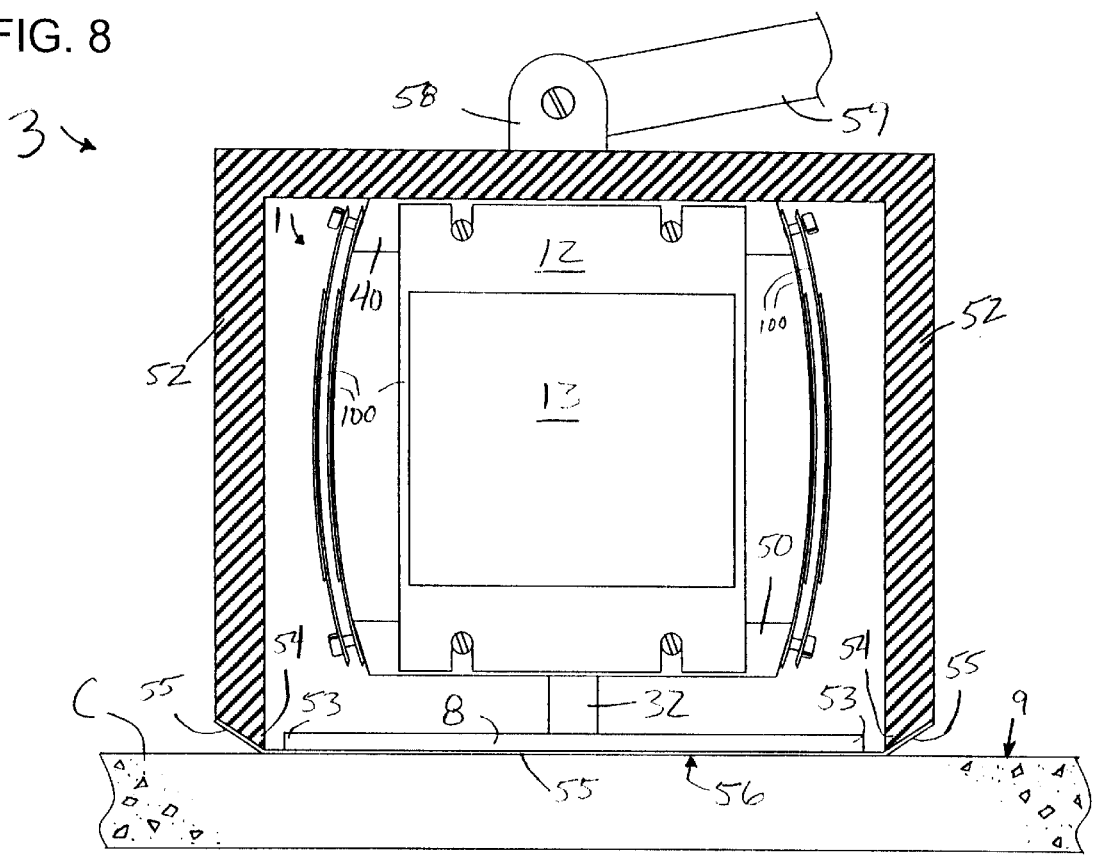
FIG. 8 is an elevation view of the piezoelectric motor of FIG. 7 mounted in a vibrational surface finishing tool.

The top and/or the bottom mounting members 40 and 50 may also be attached to one or more motion translating means. The motion translating means may comprise one or more shafts 32, pressure plates 8, blades, springs 6, gears and or pawls for translating vibratory motion into direct linear, transverse, planar or rotary motion as shown in FIGS. 1, 2 and 8.

Figure 9:
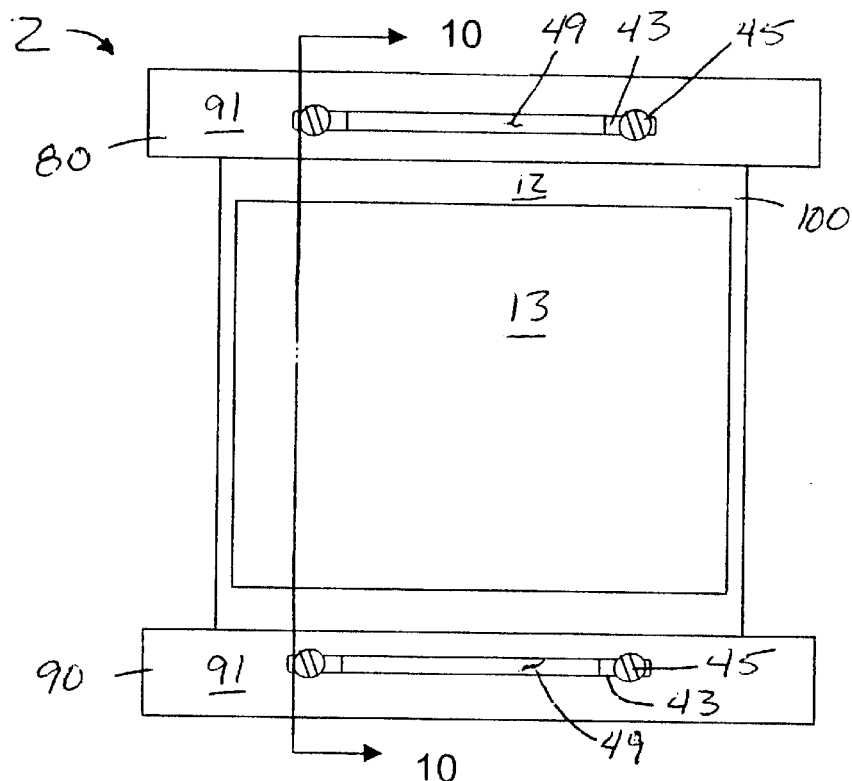
FIG. 9 is an elevational view of an alternate embodiment of of the piezoelectric actuators in top and bottom mounting members.
Figure 10:
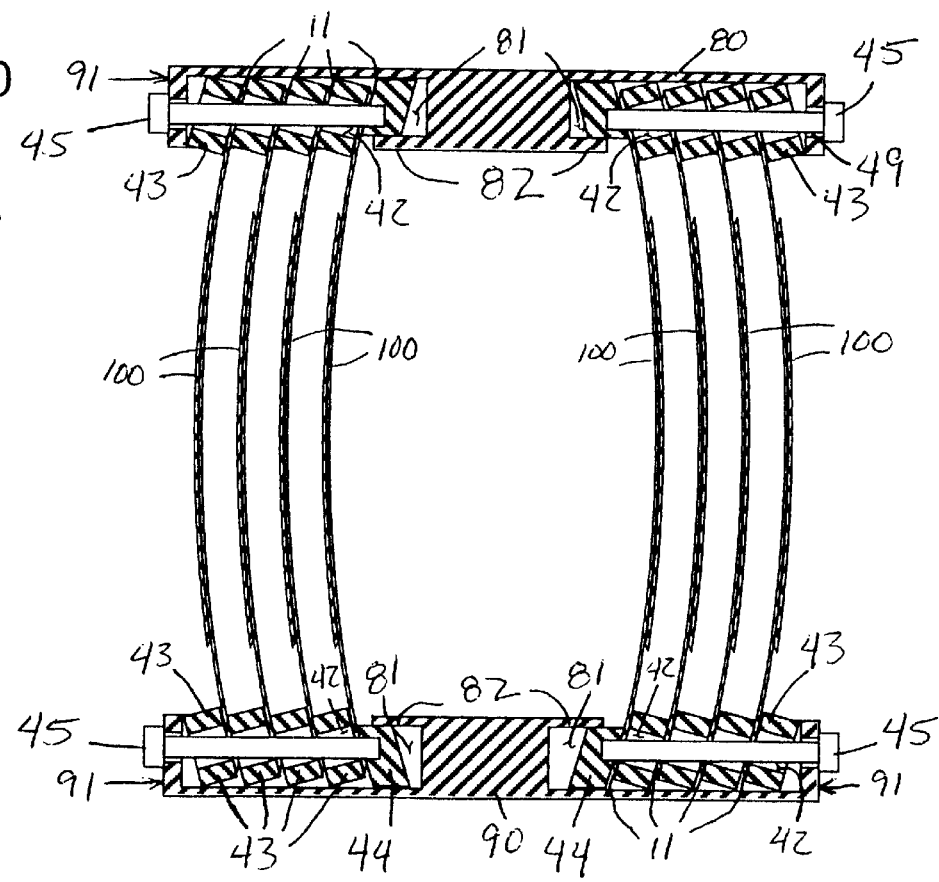
FIG. 10 is a side cross section along line 10—10 of FIG. 9.

Referring to FIGS. 9 and 10: In an alternate configuration of a motor 2, actuators 100 are also mounted "vertically" in a top housing member 80 and a base housing member 90. Each housing member 80 and 90 is a rigid structure with two recesses 81 suitable for receiving actuators 100 as well as clamping blocks 43. Each recess 81 is wide enough to receive an actuator edge 11 and long enough to receive several alternately spaced clamping blocks 43 and actuator edges 11. The recesses 81 are located on opposite ends of each mounting member 80 and 90. An aperture 49 also extends through the sides 91 of the mounting member 80 and 90 to each recess 81. The aperture 49 is at least as long as the distance between the slots 14 in the edges 11 of each actuator 100 and of suitable width for inserting a bolt 45 therethrough. On the end of each recess 81 opposite the aperture 49 is a threaded fastener 44 suitable for receiving the threaded end of a bolt 45 which has been inserted through the aperture 49 in the side 91 of the housing member 80 and 90. The threaded fastener 44 is preferably beveled to an angle with respect to the bolt 45 that matches the angle of the actuator edges 11 with respect to the bolt 45. The threaded fastener 44 may be retained in the recess 81 by a lip 82 in the recess 81.

The edges 11 of each actuator 100 are clamped into the top and base housing members 80 and 90 using the bolts 45 and a series of clamping blocks 43. The bolts 45 extend from the side 91 of the mounting member 80 and 90 through the aperture 49 in the side 91 of the housing member 80 and 90 and into the recess 81. The bolt 45 then extends alternatingly through a hole 42 in each clamping block 43 and the slot 14 in each actuator 100. The hole 42 in the clamping blocks 43 is larger than the width of the bolt 45, which allows the clamping blocks to rotate slightly with respect to the bolt 45, to accommodate the angle of the actuator edges 11 with respect to the bolt 45. After the bolt 45 passes through the last actuator's 100 slot 14, it is received in the threaded fastener 44. By tightening the bolt 44 against the side 91 of the housing member 80 and 90 and in the threaded fastener 44, the clamping blocks secure the actuator edges 11 in the recess 81 of the housing members 80 and 90. An additional clamping block 43 may be included on the bolt 45 between the last actuator 100 and the threaded fastener 44. Additionally, the first clamping block 43 may be eliminated by having an interior wall in the recess 81 in the housing member 80 and 90 which is angled to accommodate the angle of the edge 11 of the first actuator 100.

As in the embodiment of a vibrating motor 1 in FIGS. 4–6, this design of a vibrating motor 2 is simpler than prior art constructions of a vibrational motor. Weight is reduced because the spring mechanism 6 and side walls 70 are eliminated. Also, in this embodiment, the stress from spacers 33 clamped at the center of horizontally mounted actuator 100 is eliminated. The force and displacement of the actuators 100 is transmitted directly from the edges 11 into the top or base housing members 80 or 90.

Referring to FIG. 8: In the preferred embodiment of a device incorporating the above described motors 1 or 2, the motor 1 is mounted in a vibrational surface finishing tool 3. The motor 1 may be attached to a shaft 32 at either the top or the bottom mounting member 40 or 50. The shaft 32 is preferably attached at one end to the center of the mounting member 40 or 50 to more evenly distribute the force and displacement of the vibrations of the motor 1. The shaft may be attached by appropriate means such as glue or welding, or may be threaded into the mounting member 40 or 50 or may be forged integrally with the mounting member 40 or 50.

The shaft 32 is coupled at the other end to a flat plate 8. The shaft 32 is preferably attached at one end to the center of the plate 8 to evenly distribute the force and displacement of the vibrations of the motor 1. The shaft 32 may be attached to the plate 8 by appropriate means such as glue or welding, or may be threaded into the plate 8 or may be forged integrally with the plate 8. The plate 8 preferably comprises a flat rigid blade with a smooth, planar bottom surface 56. The bottom surface 56 preferably has rectangular cross-section, whose edges 53 extend at least as far as the outermost actuators 100 of the motor 1. In an alternate embodiment of the vibrational finishing tool 3, the shaft 32 may be eliminated and the motor 1 may be attached at a mounting member 40 or 50 directly to the plate 8.

The vibrational finishing tool 3 further comprises a reaction mass 52. The reaction mass 52 is attached to the mounting member 40 or 50 that has no shaft 32 or plate 8 attached to it. The reaction mass 52 may be of any shape, but is preferably box shaped, as is further described below. The main function of the reaction mass 52 is to direct the vibrations of the motor 1 downward to the plate 8 (i.e., to make the top mounting member 40 relative stationary with respect to the reaction mass 54 and work surface 9). The reaction mass 52 may also function to tune the amplitude of the vibrations of the motor 1 as well as increase the amount of force transmitted by the motor 1. The structure of the reaction mass 52 may also be used as a platform on which to advantageously mount other elements of the vibrating tool 3. Preferably, the reaction mass 52 is attached to the motor 1 at the top mounting member 40 and encloses the motor 1. The box shaped reaction mass 52 extends across the top mounting member 40 and down around the sides of the motor 1 a sufficient distance to prevent the actuators 100 or the edges 53 of the plate 8 from contacting the reaction mass 52 while the motor 1 is vibrating.

The bottom edges 54 of the reaction mass 52 preferably extend as far down as the bottom surface 56 of the plate 8 so that they share a common plane. By sharing a common plane, the bottom edges 54 of the reaction mass 52 and the bottom surface 56 of the plate 8 may be propelled across a work surface 9, such as plastic concrete C, without marring or tearing the surface 9. The bottom edges 54 of the reaction mass 52 are preferably beveled from the interior surface to the exterior surface of the box shaped mass 52. The beveled bottom edges 54 further prevent the bottom edges 54 of the reaction mass 52 from tearing or marring the work surface 9 to be finished by the finishing tool 3. The bottom edges of the reaction mass 52 and the edges 53 of the plate 8 are also preferably in close proximity, but are sufficiently spaced apart to prevent the bottom edges 54 of the reaction mass 52 and the edges 53 of the plate 8 from contacting each other when the motor 1 vibrates. A handle 59 may be pivotably attached to the reaction mass at an attachment point 58 to propel the vibrational finishing tool 3 across the work surface 9 to be finished,.

The vibrational finishing tool 3 further comprises a flexible membrane 55. The membrane 55 is preferably made of a smooth resilient material such as nylon, plastic or rubber. The membrane 55 should also be sufficiently thick and durable that it will not be punctured by either the vibrating plate 8 or by the constituents of the work surface 9 being finished. The membrane 55 is attached to the bottom edges 54 of the reaction mass 52 and to the bottom surface 56 of the plate 8. When the plate 8 vibrates up and down in response to the motor 1 vibrations, the membrane 55 forms a continuous vibrating surface between the bottom edges 54 of the reactions mass 52. This continuous surface formed by the flexible membrane 55 further prevents marring of the surface 9 to be finished by either the bottom edges 54 of the reaction mass 52 or by the edges 53 of the plate 8.

In operation electrical power is supplied to the actuators 100 of the motor 1, which causes the attached shaft 32 and plate 8 to vibrate, which further causes the flexible membrane 55 to vibrate. It will be understood that if the frequency of the electrical power supplied to the actuator 100 corresponds to a natural frequency of oscillation of the motor 1 (i.e., the actuators 100, attached mounting members 40 and 50 and plate 8) then the amount of electrical energy required to oscillate the motor 1 at a given amplitude of oscillation can be minimized.

Accordingly, it will be appreciated that by constructing the motor 1 in accordance with the foregoing description, and applying electrical energy to the actuators 100 at a frequency corresponding to a natural frequency of oscillation of the combined actuator element 12, plate 8, and attached mounting members 40 and 50, the magnitude of vibrational energy which can be generated and transmitted through the plate 8 to the work surface 9 of a plastic concrete mass C can be maximized while the amount of electrical energy input necessary to generate the vibrational energy output is minimized.

In operation, the vibrating tool 3 is placed upon the top of a work surface 9, such as a plastic concrete mass C. An alternating electric current is applied to each of the actuators 100 in the motor 1 via electric wires 24 connected to the power supply 22. Each actuator 100 vibrates at a frequency corresponding to the frequency of the applied current. The character of the current transmitted to the actuators 100 may be tuned to vary the frequency of the electrical signal to the actuators 100, (and, correspondingly) the frequency at which the actuators 100 vibrate. Preferably the electrical energy may be tuned to output frequencies of approximately 100 Hertz, approximately 200 Hertz, and a frequency corresponding to the natural resonant frequency of the entire tool assembly (including the actuators 100, mounting members 40 and 50 and plate 8). It has been found that by vibrating the motor 1 at a frequency corresponding to the natural resonant frequency of tool 3, the tool 3 imparts the highest amount of vibrational energy into the concrete mass C and with optimal efficiency. To optimize the energy efficiency of the device, the frequency of the electrical signal (and therefore the frequency of the vibrating actuators 100 and motor 100) is preferably selected to correspond to a natural frequency of the motor assembly (including the actuators 100, mounting members 40 and 50 and the plate 8).

In operation, the vibrating tool 3 is pulled across the top of a work surface 9, for example of a plastic concrete mass C. Water, air and fines near the surface 9 of the concrete are forced to the top by the vibrational energy imparted to the medium through the plate 8 and vibrating flexible membrane 55 of the tool 3. The water accumulates on the surface 9 of the plastic concrete mass C and creates a lubricant for the tool 3, making it easier to move it across the surface 9 of the plastic concrete C than would be possible with a conventional (i.e. non-vibrating) hand trowels. The fines and water which accumulate at the surface 9 of the concrete C create a slurry which is highly desirable for producing a smooth finished surface.

Because the motion of the motors 1 or 2 is principally along vertical axes, the plate 8 and flexible membrane 55 predominantly oscillate in an up-and-down motion. For example, flexible membrane 3 of the vibrating tool 3 constructed in accordance with the materials and dimensions described above may typically oscillate "up-and-down" approximately 0.010" or less; and any displacement of the sides of the tool 3 in the horizontal plane would typically be less than one-thousandth of an inch. As will be appreciated by those skilled in the art, because there is virtually no horizontal displacement, and because the tool is relatively small and light-weight it is very easy to handle and is useful for working near edges and corners. As a result of these characteristics, less work output is needed by the operator.

It will be understood from the above description that the actuators 100 and motors 1 and 2 used in the present invention are very lightweight and comprise very few parts. Therefore, maintenance costs for the device are kept at a minimum. These characteristics are advantageous when compared to the bulk and intricacy of the motors, solenoids, etc., which are used in prior vibrating tools. As can be seen by review of the above description the invention disclosed provides a vibrating surface finishing tool 3 which is compact, light-weight and easy to use. The simplicity of the design provides for ease of maintenance and long-life. The invention also efficiently imparts a high amount of energy into a work surface 9 such as concrete and minimizes the vibrational energy dissipated through the handle and into the operator's hand. In the preferred embodiment of the invention, the device is battery operated and the frequency of the vibrations is readily adjustable. It will be understood from the foregoing description that when a surface finishing tool 3 constructed in accordance with the present invention is pulled (or "wiped") across the surface 9 of a plastic concrete mass C it produces a water/fine slurry at the surface 9. The slurry lubricates the blade/concrete interface (i.e., the flexible membrane). As a result of the slurry and the lubrication a smooth surface finish is created without necessitating a back and forth wiping motion.

In a modification of the present invention, two or more motors 1 or 2 constructed substantially as described herein above may be assembled together to compose a larger, multi-motor tool. In a multi-motor tool, several individual vibrating motors 1 (each constructed substantially in accordance with the preceding description of the preferred embodiment of the present invention) may be attached to a common reaction mass 52 and a common flexible membrane 55. Adjacent vibrating motors 1 may be secured to each other by fasteners (not shown) or similar fastening means. In the multi-motor vibrating tool 3, the handle 59 (which is used in the preferred embodiment of the invention) is attached to the common reaction mass 52 and is used to pull the multi-motor tool 3 across the work surface 9. Electrical power to the individual motors 1 may be provided by a common power supply 22 located inside of the elongated handle 59, inside of the center of the handle 59, on an operator-worn belt, or elsewhere. Alternatively, each individual motor 1 may be provided with its own individual power supply 22, as described above with respect to the preferred embodiment of the invention.

It will be appreciated that a multi-motor vibrating tool 3 constructed in accordance with the foregoing description can be advantageously operated in substantially the same manner as the preferred embodiment of the invention, by an operator in a standing position, and that such a tool 3 may be advantageously used to finish remote, or difficult to reach areas, without requiring that the operator stand or kneel in the wet concrete C. It will be understood that any number of vibrating motors 1 may be used, and that the motors 1 may be oriented side-to-side, or staggered, or in other configurations. Also, although it is preferable that the various motors 1 of a multi-motor vibrating tool 3 be similar size and construction, and that the each vibrate at the same frequency (i.e. corresponding to identical natural frequencies of their motor assemblies), it is within the scope of the present invention to construct multi-motor vibrating tool 3 in which the various motors 1 are of differing sizes and which vibrate at varying frequencies.

While the above description contains many specificities, these should not be construed as limitations on the scope of the invention, but rather as an exemplification of one preferred embodiment thereof. Many other variations are possible, for example:

A power cord that may be provided for connection to a typical a/c wall outlet, creating a frequency of 60 Hertz;

The actuators may be normally curved when non-energized, or they may alternatively be normally flat when non-energized;

The blade and/or flexible membrane of the tool may be modified so that the tool may be used as a polisher, a sander, or a mixer;

The tool may be used to vibrate or smooth plastic/slurry mixtures other than concrete;

The tool may be constructed with larger dimensions and/or comprising vibrator modules so that it can be used as a screed, a float, an edger or other similar concrete finishing tools;

Non-"THUNDER™TM" piezoelectric actuators, including magneto-strictive, and ferroelectric, may be used to produce the vibrations;

The number of actuators may vary;

More than two mounting members may be used. Actuators may this way be "vertically" stacked to provide greater displacement than a single actuator does along a vertical axis The current may be adjusted by an external AC voltage generator. In this modification of the invention any frequency that is desired within the target range may be applied;

Accordingly, the scope of the invention should be determined not by the embodiment illustrated, but by the appended claims and their legal equivalents.

What is claimed is:

1. A vibratory motor, comprising:

a first mounting member having a first attachment point;

a second mounting member having a second attachment point;

a first piezoelectric actuator comprising an electroactive ceramic layer bonded to a substrate;

said first piezoelectric actuator having an arcuate shape such that first and second arced edges of said first actuator are disposed on nonadjacent sides of said arcuate shape and such that first and second ends of said first actuator are disposed on nonadjacent sides of said arcuate shape;

said first end of said first actuator being attached to said first mounting member at said first attachment point;

said second end of said first actuator being attached to said second mounting member at said second attachment point;

a variable magnitude of curvature of said arcuate shape being characterized by a distance between said first and second ends of said first actuator at said first and second attachment points along a plane intersecting said first and second attachment points;

electrical energizing means for applying a voltage across said electroactive ceramic layer;

said distance between said first and second ends of said first actuator being increasable by application of a first voltage of a first polarity across said electroactive ceramic layer, whereby said magnitude of curvature of said first actuator decreases when said distance between said first and second ends of said first actuator increases;

said distance between said first and second ends of said first actuator being decreasable by application of a second voltage of a second opposite polarity across said electroactive ceramic layer, whereby said magnitude of curvature of said first actuator increases when said distance between said first and second ends of said first actuator decreases;

and whereby said application of said first or second voltage across said electroactive ceramic layer causes said first and second mounting members to move with respect to each other parallel to said plane.

2. The vibrating motor of claim 1, wherein said first mounting member comprises a first polygonal solid having a first thickness and a first cross section perpendicular to said first thickness;

wherein said second mounting member comprises a second polygonal solid having a second thickness and a second cross section perpendicular to said second thickness;

and wherein said first cross-section is of substantially the same shape as said second cross section.

3. The vibrating motor of claim 2, further comprising:

a second piezoelectric actuator comprising an electroactive ceramic layer bonded to a substrate;

said second piezoelectric actuator having an arcuate shape such that first and second arced edges of said actuator are disposed on nonadjacent sides of said arcuate shape and such that first and second ends of said actuator are disposed on nonadjacent sides of said arcuate shape;

said first end of said second actuator being attached to said first mounting member at a third attachment point;

said second end of said second actuator being attached to said second mounting member at a fourth attachment point.

4. The vibrating motor of claim 3, wherein said first attachment point and said third attachment point are disposed on a first side of said first polygonal solid;

wherein said second attachment point and said fourth attachment point are disposed on a first side of said second polygonal solid.

5. The vibrating motor of claim 3, wherein said first attachment point is disposed on a first side of said first polygonal solid;

wherein said third attachment point is disposed on a second side of said first polygonal solid;

wherein said second attachment point is disposed on a first side of said second polygonal solid;

wherein said fourth attachment point is disposed on a second side of said second polygonal solid;

wherein said first piezoelectric actuator is attached to said first mounting member on said first side of said first polygonal solid;

wherein said first piezoelectric actuator is attached to said second mounting member on said first side of said second polygonal solid;

wherein said second piezoelectric actuator is attached to said first mounting member on said second side of said first polygonal solid;

and wherein said second piezoelectric actuator is attached to said second mounting member on said second side of said second polygonal solid.

6. The vibrating motor of claim 5, wherein said first side and said second side of said first polygonal solid are adjacent each other;

and wherein said first side and said second side of said second polygonal solid are adjacent each other.

7. The vibrating motor of claim 5, wherein said first side and said second side of said first polygonal solid are non-adjacent;

and wherein said first side and said second side of said second polygonal solid are non-adjacent.

8. The vibrating motor of claim 6, wherein said cross section of said first or second polygonal solid has four sides.

9. The vibrating motor of claim 8, wherein a piezoelectric actuator is attached to said first mounting member and said second mounting member on each of said four sides of said first or second polygonal solid.

10. The vibrating motor of claim 3, wherein said first mounting member further comprises a mounting surface at said first attachment point, said mounting surface forming a first angle with said plane;

wherein said first end of said first piezoelectric actuator has a first face, said first face forming a second angle with said plane;

and wherein said first angle is equal to said second angle.

11. The vibrating motor of claim 10, wherein said mounting surface comprises a beveled side of said first or second polygonal solid.

12. The vibrating motor of claim 10, wherein said first mounting member further comprises a recess in said first polygonal solid;

and wherein said mounting surface comprises at least one spacer member rotatably mounted within said recess to engage said first end of said first piezoelectric actuator.

* * * * *